(12) United States Patent
Xu

(10) Patent No.: US 10,830,809 B2
(45) Date of Patent: Nov. 10, 2020

(54) PLACEMENT OF DAMAGE SENSORS IN AN AIR-TEMPERATURE-MANAGED EQUIPMENT ENCLOSURE

(71) Applicant: Nokia Technologies Oy, Espoo (FI)

(72) Inventor: Chen Xu, Murray Hill, NJ (US)

(73) Assignee: Nokia Technologies Oy, Espoo (FI)

( * ) Notice: Subject to any disclaimer, the term of this patent is extended or adjusted under 35 U.S.C. 154(b) by 166 days.

(21) Appl. No.: 16/164,079

(22) Filed: Oct. 18, 2018

(65) Prior Publication Data

US 2020/0124659 A1    Apr. 23, 2020

(51) Int. Cl.
*G01R 31/28*    (2006.01)

(52) U.S. Cl.
CPC ..... *G01R 31/2812* (2013.01); *G01R 31/2836* (2013.01); *G01R 31/2856* (2013.01)

(58) Field of Classification Search
CPC ............ G01R 31/2836; G01R 31/2856; G01N 17/043
See application file for complete search history.

(56) References Cited

U.S. PATENT DOCUMENTS

| | | | |
|---|---|---|---|
| 10,067,179 B2 | 9/2018 | Xu | |
| 2013/0180271 A1* | 7/2013 | Kuczynski | H05K 7/20736 62/93 |
| 2013/0278120 A1* | 10/2013 | Elkins | H05K 5/0213 312/236 |
| 2014/0036446 A1* | 2/2014 | Fuchs | F28F 3/00 361/697 |
| 2014/0074312 A1 | 3/2014 | Bates et al. | |

OTHER PUBLICATIONS

Xu, C., "Detecting Deterioration of an Electrical Circuit in an Aggressive Environment," U.S. Appl. No. 16/101,916, as filed with the United States Patent and Trademark Office on Aug. 13, 2018, 29 pages.

Keane, R. D., et al. "Optimization of particle image velocimeters. I. Double pulsed systems," Meas. Sci. Technol., vol. 1, No. 11, pp. 1202-1215, 1990.

Lading, L., et al. "Optical Diagnostics for Flow Processes." New York, NY, USA: Springer, 1994.

(Continued)

*Primary Examiner* — Alvaro E Fortich
(74) *Attorney, Agent, or Firm* — Mendelsohn Dunleavy, P.C.; Yuri Gruzdkov

(57) ABSTRACT

A temperature-managed equipment enclosure, wherein the fans are configured to draw air from the environment, and wherein damage sensors are distributed in a non-uniform and/or targeted manner. In an example embodiment, most of the damage sensors may be placed within a relatively narrow zone downstream from the cooling fans. In some embodiments, a relatively large percentage of the damage sensors may be placed in the areas characterized by one or more of the following: (i) relatively high linear velocity of the airflow; (ii) turbulent airflow; and (iii) a certain range of angles of impingement of airflow on the equipment surfaces. Advantageously, the disclosed placement of damage sensors can be used to enhance the ability to detect environmentally induced equipment damage with high sensitivity and/or certainty.

22 Claims, 9 Drawing Sheets

(56) References Cited

OTHER PUBLICATIONS

Stafford, J., et al. "Aerodynamic performance of a vibrating piezoelectric blade under varied operational and confinement states," IEEE Trans. Comp. Pack. Manu. Tech., vol. 7, No. 5, pp. 751-761, 2017.
Raffel, M., et al. "Particle Image Velocimetry: A Practical Guide," 2nd ed. Berlin, Germany: Springer-Verlag, 2007.
Stafford, J., et al. "A statistical analysis for time-averaged turbulent and fluctuating flow fields using particle image velocimetry," Flow Meas. Instrum., vol. 26, pp. 1-9, 2012.
Tencer, M., "Deposition of aerosol ("hygroscopic dust") on electronics—Mechanism and risk," Microelec. Rel., vol. 48, No. 4, pp. 584-593, 2008.
Extended European Search Report from corresponding European application No. 19202198.8; dated Apr. 7, 2020 (8 pages).

* cited by examiner

500

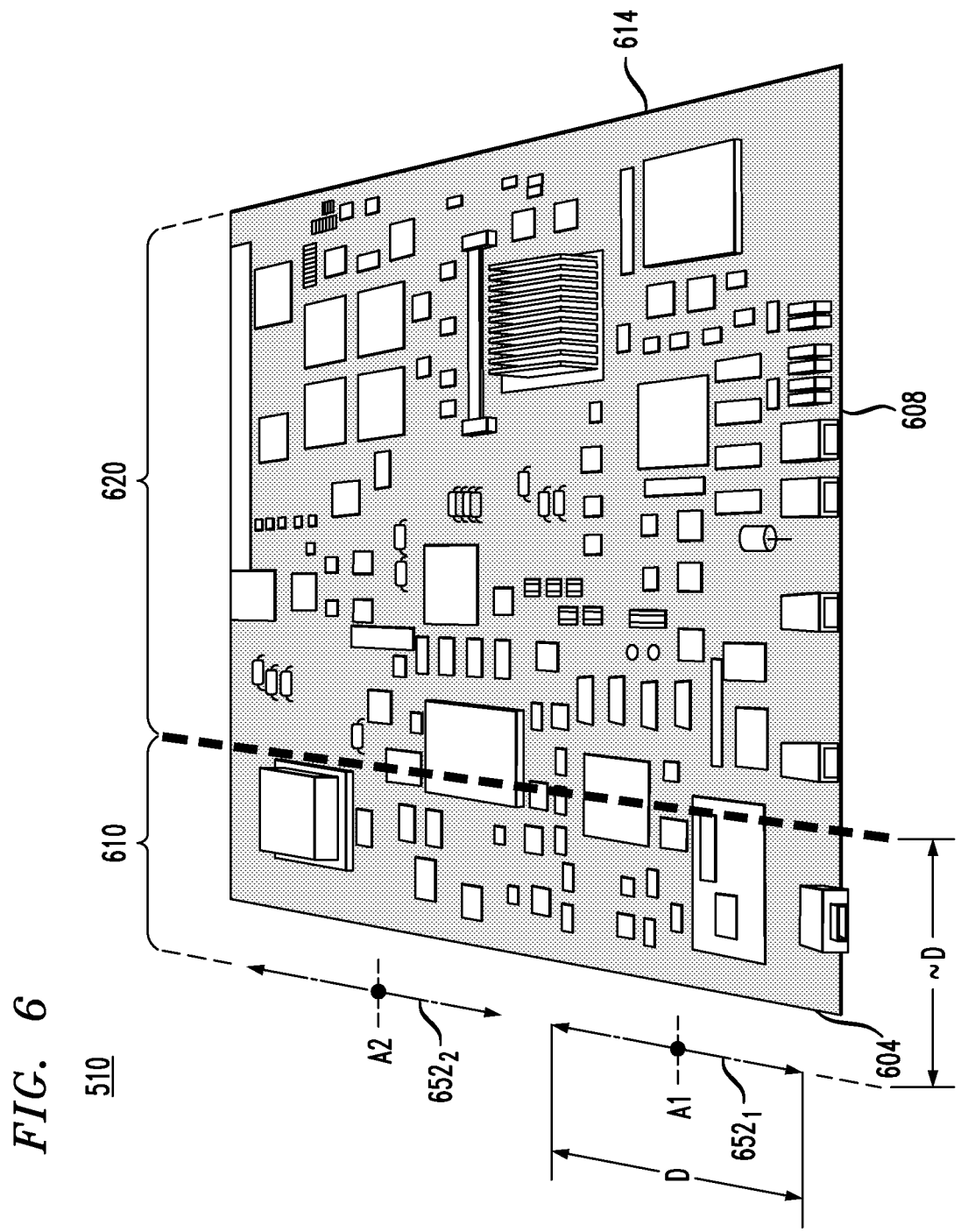

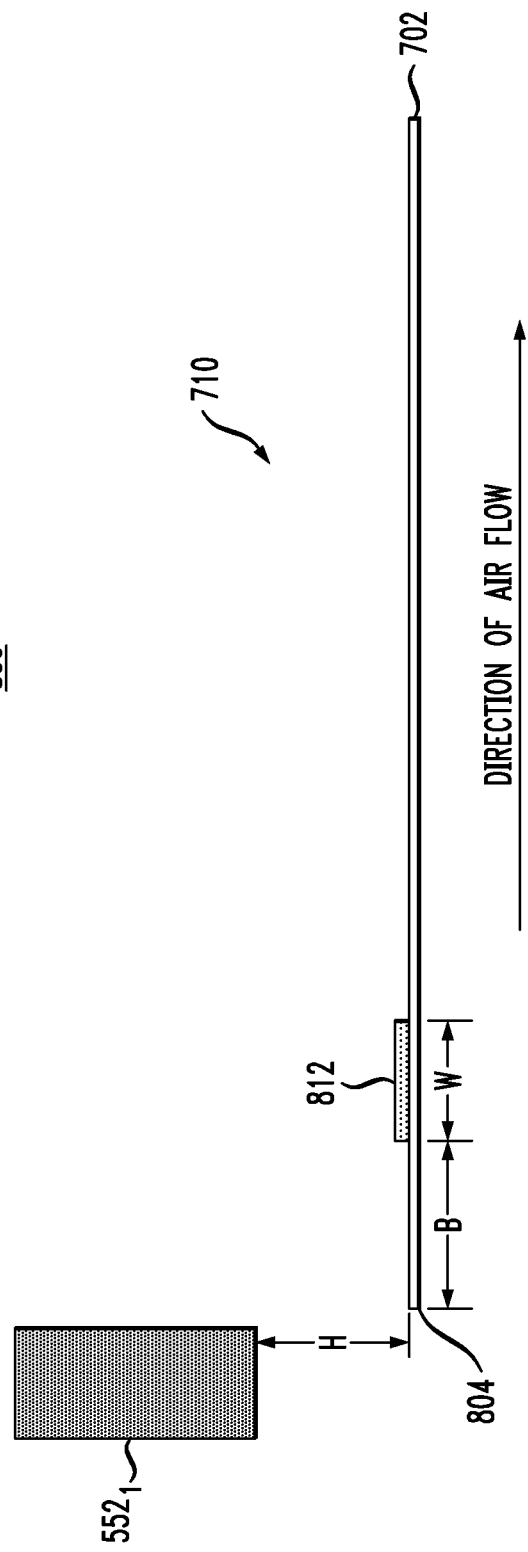

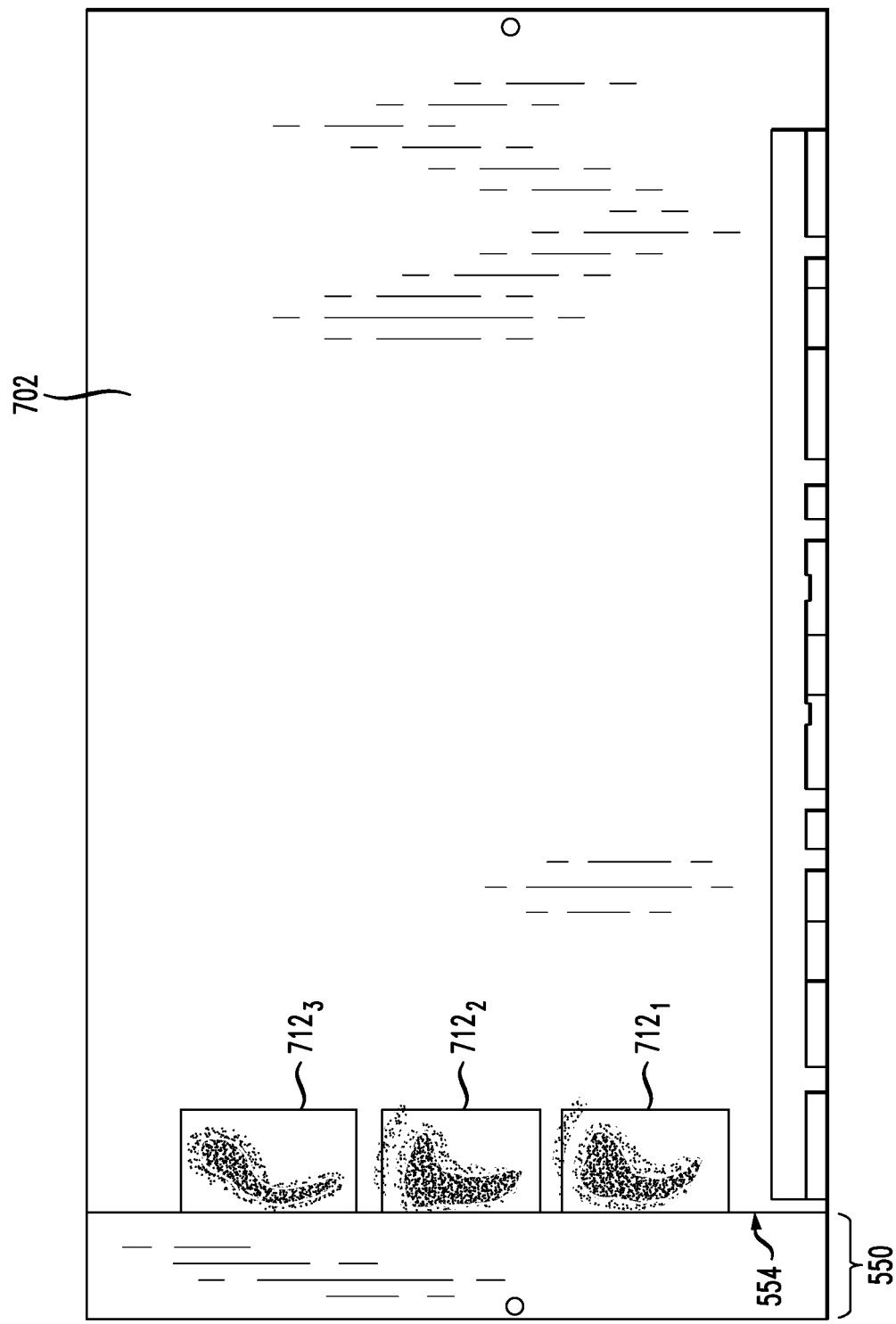

PLACEMENT OF DAMAGE SENSORS IN AN AIR-TEMPERATURE-MANAGED EQUIPMENT ENCLOSURE

BACKGROUND

Field

The present disclosure relates to electrical equipment having sensors for estimating damage thereto.

Description of the Related Art

This section introduces aspects that may help facilitate a better understanding of the disclosure. Accordingly, the statements of this section are to be read in this light and are not to be understood as admissions about what is in the prior art or what is not in the prior art.

Environmental conditions can have a drastic effect on the reliability and performance of electrical circuits, such as those used in the telecom equipment deployed in geographic regions characterized by harsh environments. For example, the adverse effects of exposure to extreme temperatures, high humidity, atmospheric dust, and corrosive agents can cause some electrical circuits to fail. It is therefore desirable to have a system in place that can estimate the working condition of environmentally exposed circuits and warn the equipment operator when a remedial action appears to be justified.

SUMMARY OF SOME SPECIFIC EMBODIMENTS

Disclosed herein are various embodiments of electrical equipment that may have: (i) cooling fan(s) to produce an airflow over electrical circuits by drawing air from the environment and (ii) damage sensors distributed in a non-uniform and/or targeted manner therein. In an example embodiment, one or more damage sensors may be placed within a narrow airflow zone, downstream from the cooling fans. In some embodiments, the placement of the damage sensor(s) may be characterized by one or more of the following: (i) the damage sensor(s) receive relatively high velocity airflow; (ii) the damage sensor(s) receive a turbulent portion of the airflow; and (iii) the damage sensor(s) receive a part of the airflow with a limited range of angles of impingement. Advantageously, such a placement of the damage sensor(s) can enhance the ability to detect environmentally induced equipment damage, e.g., with high sensitivity and/or certainty, as compared to said ability for the electrical equipment in which said damage sensor(s) are not so placed.

According to an example embodiment, provided is an apparatus comprising: a circuit board located in an enclosure; and one or more cooling fans configured to generate airflow by drawing ambient air into the enclosure; wherein the circuit board has a plurality of resistive sensors thereon, the resistive sensors being non-uniformly distributed over at least first and second portions thereof, each of the resistive sensors having a respective electrical resistance that changes in response to damage caused by environmental exposure induced by the airflow, the second surface portion being on average further away from the one or more cooling fans than the first surface portion; and wherein the first surface portion has a greater number of the resistive sensors than the second surface portion.

According to another example embodiment, provided is an apparatus comprising: a circuit board located in an enclosure for electrical equipment; one or more fans configured to generate an airflow along a major surface of the circuit board by drawing external air into the enclosure, each of the one or more fans having an exhaust along an edge of the circuit board; and a plurality of resistive sensors supported on the circuit board, the resistive sensors being on average closer to the exhaust than most of the circuit board, each of the resistive sensors having a respective electrical resistance configured to change in response to damage caused by material carried in the airflow.

According to yet another example embodiment, provided is an apparatus comprising: a circuit board located in an enclosure; one or more fans configured to generate an airflow along a major surface of the circuit board by drawing external air into the enclosure, each of the one or more fans having an exhaust along an edge of the circuit board; and a plurality of resistive sensors located in a local area susceptible to a heaver deposition per unit area of particulate matter capable of settling out of the airflow than an average deposition per unit area of said particulate matter on the circuit board.

BRIEF DESCRIPTION OF THE DRAWINGS

Other aspects, features, and benefits of various disclosed embodiments will become more fully apparent, by way of example, from the following detailed description and the accompanying drawings, in which:

FIG. 6 shows a perspective view of the main circuit board that can be used in the air-cooled equipment cabinet of FIG. 5 according to an embodiment;

FIG. 8 shows a side view of a fan/circuit arrangement that can be used in the equipment cabinet of FIG. 5 according to another embodiment; and FIG. 9 shows an example pattern of circuit damage that can occur in the equipment cabinet of FIG. 5 according to an embodiment.

DETAILED DESCRIPTION

Some embodiments may benefit from at least some features disclosed in U.S. Pat. No. 10,067,179 and U.S. patent application Ser. No. 16/101,916, both of which are incorporated herein by reference in their entirety.

Figure 1:
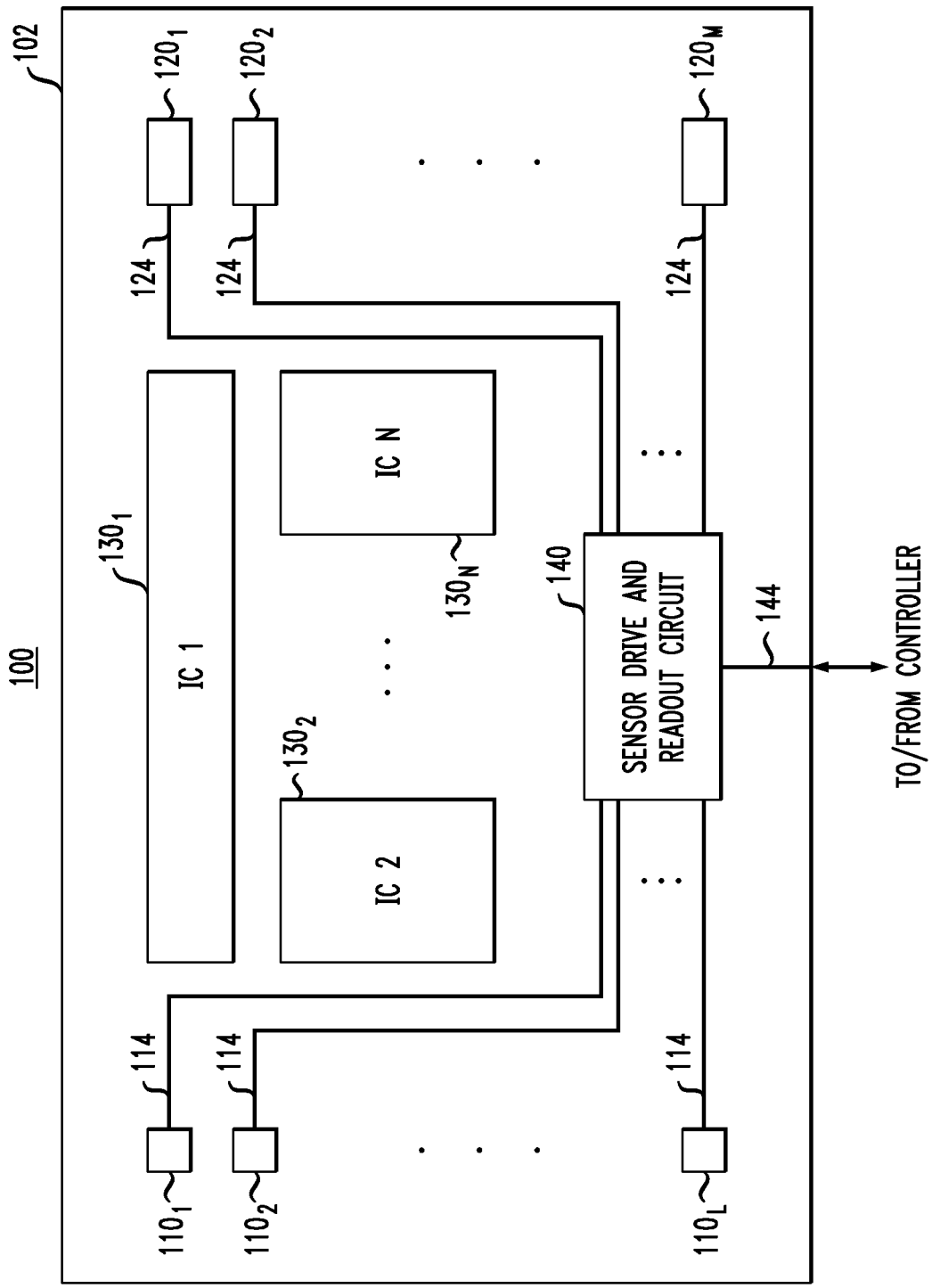
FIG. 1 shows a block diagram of an electrical circuit according to an embodiment.

FIG. 1 shows a block diagram of an electrical circuit 100 according to an embodiment. Circuit 100 includes a printed circuit board (PCB) 102 that mechanically supports and electrically connects various electronic components of the circuit using conductive tracks, pads, and other features etched from the sheet(s) of an electrically conductive material laminated onto a non-conductive (e.g., dielectric) substrate. For illustration purposes and without any implied limitation, only some of the conductive tracks, e.g., labeled 114 and 124, of PCB 102 are shown in FIG. 1. In various embodiments, PCB 102 can be single sided (e.g., having conductive tracks arranged in a single surface layer), double sided (e.g., having conductive tracks arranged in two surface layers), or multi-layered (e.g., having a multi-layer stack of conductive tracks electrically interconnected using conductive vias).

In an example embodiment, the electronic components of circuit 100 may include an assortment of one or more integrated-circuit (IC) packages and/or one or more discrete circuit elements (such as capacitors, resistors, inductors, and/or active devices) that are typically soldered onto PCB 102. In some embodiments, some of the electronic components of circuit 100 may be embedded into the substrate of PCB 102. For illustration purposes and without any implied limitation, circuit 100 is depicted in FIG. 1 as having the following circuit components: (i) a plurality of sensors $110_1$-$110_L$, (ii) a plurality of sensors $120_1$-$120_M$, (iii) one or more IC packages $130_1$-$130_N$, and (iv) a sensor drive-and-readout circuit 140, where each of L and M is an integer greater than one, and N is a positive integer. Embodiments in which L=2, or M=2, or L=M=2 are also possible. In some embodiments, IC packages $130_1$-$130_N$ are optional and may be absent. Embodiments in which N=1 or 2 are also possible.

Sensors $110_1$-$110_L$ are electrically connected to the sensor drive-and-readout circuit 140 by way of conductive tracks 114. Sensors $120_1$-$120_M$ are similarly electrically connected to the sensor drive-and-readout circuit 140 by way of conductive tracks 124. Circuit 140 can be electrically connected to an external electronic controller by way of conductive tracks 144. In operation, circuit 140 can perform one or more of the following functions: (i) respond to control signals received by way of conductive tracks 144 from an external electronic controller to perform resistance measurements of individual sensors $110_1$-$110_L$ and $120_1$-$120_M$; (ii) generate and apply various voltages and/or currents to individual sensors $110_1$-$110_L$ and $120_1$-$120_M$; (iii) sense and measure various voltages and/or currents at sensors $110_1$-$110_L$ and $120_1$-$120_M$; (iv) perform signal processing to determine resistance values corresponding to individual sensors $110_1$-$110_L$ and $120_1$-$120_M$; and (v) generate control signals for the external electronic controller that indicate the estimated working condition of IC packages $130_1$-$130_N$ and/or other electronic circuits and devices located in relatively close proximity to circuit 100. In various embodiments, circuit 140 can be implemented as an application-specific integrated circuit (ASIC) or a microcontroller.

In an example embodiment, circuit 100 can be housed in an air-cooled equipment enclosure, such as a cabinet, rack, box, or the like (not explicitly shown in FIG. 1; see FIG. 5), that contains telecommunication equipment. In some embodiments, IC packages $130_1$-$130_N$ may comprise electronic and/or optical circuits and devices that are part of the telecommunication equipment. Sensors $110_1$-$110_L$ and $120_1$-$120_M$ and the sensor drive-and-readout circuit 140 can be used to estimate the adverse effects of environmental exposure on the telecommunication equipment housed in the same equipment enclosure as circuit 100, e.g., as further described below in reference to FIGS. 2-4. In embodiments in which IC packages $130_1$-$130_N$ are absent, circuit 100 is a dedicated circuit that can be used primarily or exclusively for such estimation purposes. The information obtained using sensors $110_1$-$110_L$ and $120_1$-$120_M$ can beneficially be used, e.g., to forecast the demand for spare parts, minimize or avoid the costly network outage caused by impending equipment failure, and/or flag an offending site in order to limit further equipment deployment therein, implement a site improvement, or initiate equipment relocation therefrom.

Figure 2:
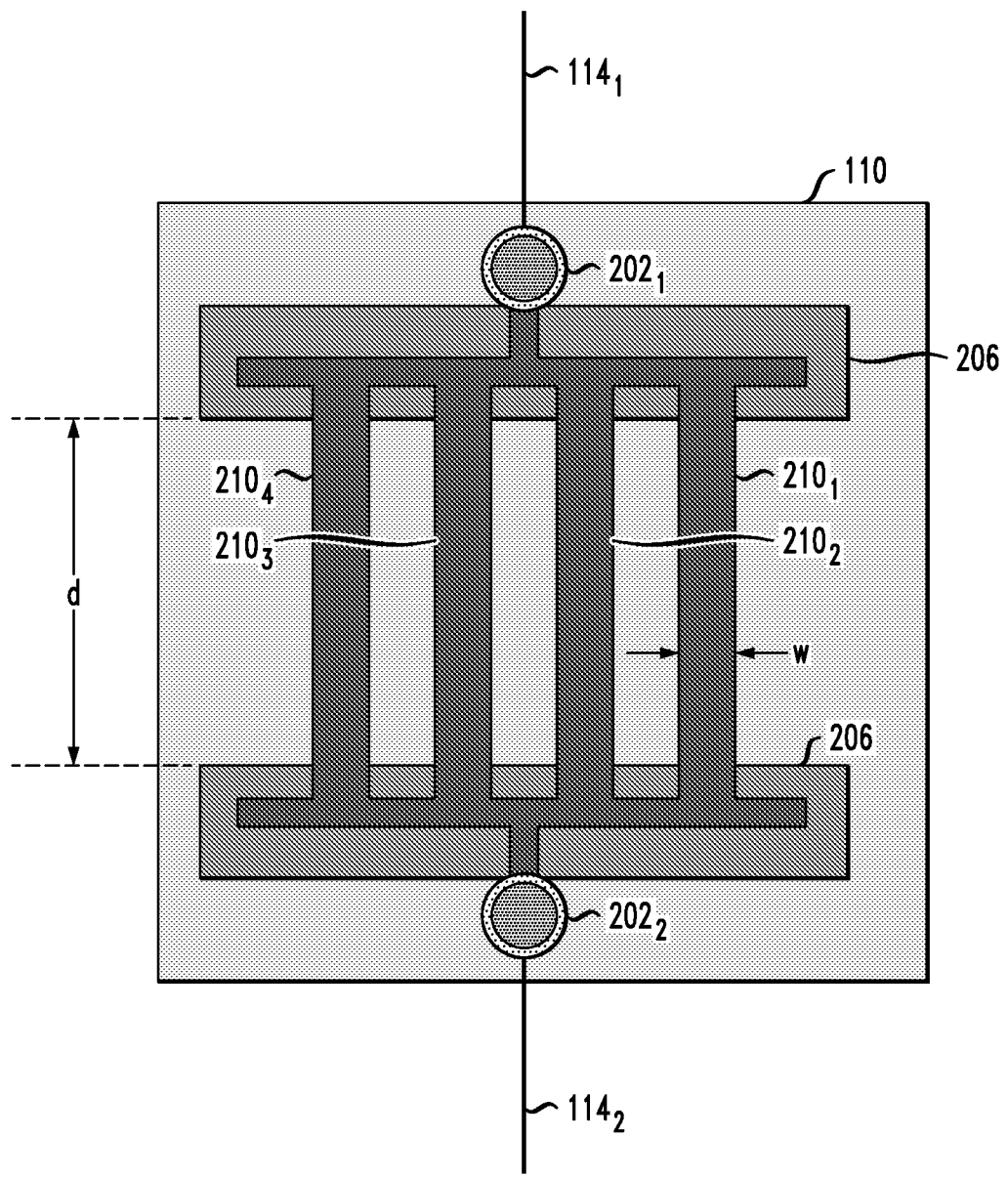
FIG. 2 shows a schematic view of a first sensor that can be used in the electrical circuit of FIG. 1 according to an embodiment.

FIG. 2 shows a schematic view of an individual sensor 110 that can be used in circuit 100 (FIG. 1) according to an embodiment. Sensor 110 can be electrically connected to the sensor drive-and-readout circuit 140 using conductive tracks $114_1$ and $114_2$ connected to contact pads $202_1$ and $202_2$, respectively, of the sensor as indicated in FIG. 2. As already indicated above, conductive tracks $114_1$ and $114_2$ can be used to perform one or more of the following: (i) apply a desired voltage to sensor 110; (ii) sense a voltage across sensor 110; (iii) drive a desired current through sensor 110; and (iv) sense a current flowing through sensor 110.

In an example embodiment, sensor 110 comprises a plurality of electrically conductive traces 210 that are connected in parallel to one another between contact pads $202_1$ and $202_2$, e.g., as indicated in FIG. 2. For illustration purposes and without any implied limitation, sensor 110 is depicted in FIG. 2 as having four such electrically conductive traces, which are labeled $210_1$-$210_4$. In an alternative embodiment, sensor 110 may have a different (from four) number of conductive traces 210.

Each of conductive traces $210_1$-$210_4$ comprises a substantially flat metal stripe that has a constant width w and a constant thickness t. For illustration, the width w is indicated in FIG. 2 for conductive trace $210_1$. The thickness t represents the dimension of conductive trace 210 in the direction that is orthogonal to the plane of FIG. 2. The ends of conductive traces $210_1$-$210_4$ are encapsulated using stripes 206 of a suitable protective (e.g., polymeric or ceramic) material. This protective material serves to ensure good electrical contact between conductive traces $210_1$-$210_4$ and contact pads $202_1$ and $202_2$ in field conditions where the exposed middle portions of the conductive traces might be subjected to an aggressive or harsh environment. The length of the exposed middle portions of conductive traces $210_1$-$210_4$ is labeled in FIG. 2 as d.

In an example embodiment, the width w, the length d, and the thickness t of conductive traces $210_1$-$210_4$ are selected such that the initial resistance of sensor 110 is in the range between approximately $0.1\Omega$ and approximately $10\Omega$. Environmental exposure typically causes the resistance of sensor 110 to increase over time, e.g., due to corrosion and/or erosion of conductive traces $210_1$-$210_4$. A person of ordinary skill in the art will understand that, for the indicated resistance range, good electrical contacts between conductive traces $210_1$-$210_4$ and contact pads $202_1$ and $202_2$ protected by the encapsulating stripes 206 help to achieve sufficient accuracy/precision of the corresponding resistance measurements.

Different instances of sensor 110 used in circuit 100 (FIG. 1) may differ from one another in one or more of the following characteristics: (i) the material of conductive traces 210; (ii) the width w of conductive traces 210; (iii) the thickness t of conductive traces 210; and (iv) the length d of exposed portions of conductive traces 210. Example materials that can be used to make conductive traces 210 include but are not limited to copper, silver, aluminum, tin, lead, nickel, zinc, iron, and various alloys and/or multi-layered metal structures thereof. The materials for conductive traces 210 are typically selected from the material set used in PCB 102, IC packages $130_1$-$130_N$, and other electronic circuits and devices expected to be located in the same equipment enclosure as circuit 100. In an example embodiment, sensors $110_1$-$110_L$ may include at least one sensor 110 whose conductive traces 210 are made of copper and at least one sensor 110 whose conductive traces 210 are made of silver.

Figure 3:
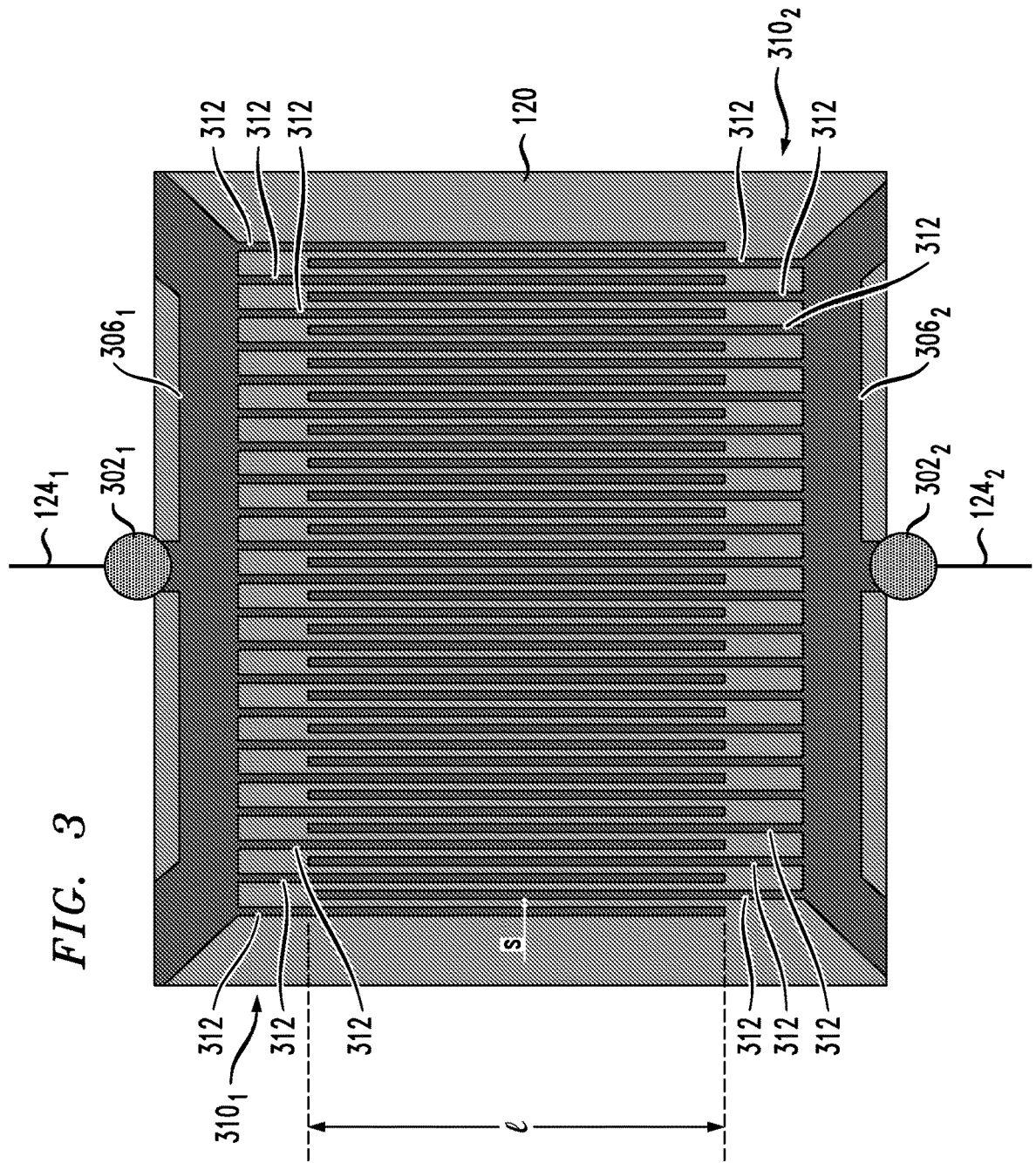
FIG. 3 shows a schematic view of a second sensor that can be used in the electrical circuit of FIG. 1 according to an embodiment.

FIG. 3 shows a schematic view of an individual sensor 120 that can be used in circuit 100 (FIG. 1) according to an embodiment. Sensor 120 can be electrically connected to the sensor drive-and-readout circuit 140 using conductive tracks $124_1$ and $124_2$ connected to contact pads $302_1$ and $302_2$, respectively, of the sensor as indicated in FIG. 3. Conductive tracks $124_1$ and $124_2$ can be used to perform one or more of the following: (i) apply a desired voltage to sensor 120; (ii) sense a voltage across sensor 120; (iii) drive a desired current through sensor 120; and (iv) sense a current flowing through sensor 120.

In an example embodiment, sensor 120 comprises interleaved combs $310_1$ and $310_2$. A base $306_1$ of comb $310_1$ is electrically connected to contact pad $302_1$ as indicated in FIG. 3. A base $306_2$ of comb $310_2$ is similarly electrically connected to contact pad $302_2$. For illustration purposes and without any implied limitation, comb $310_1$ is depicted in FIG. 3 as having 21 teeth 312, and comb $310_2$ is depicted as having 20 teeth 312. In an alternative embodiment, each of combs $310_1$ and $310_2$ may have a different respective number of teeth 312.

In an example embodiment, each of teeth 312 is an electrically conductive (e.g., metal) trace that comprises a substantially flat metal stripe of a constant width and a constant thickness. The spacing s and the overlap length l between teeth 312 belonging to different ones of combs $310_1$ and $310_2$ are selected such that the initial surface insulation resistance (SIR) of sensor 120 is greater than 10 M$\chi$, but can decrease over time to fall into the range between approximately 10Ω and approximately 10 MΩ due to environmental exposure. For illustration, the spacing s and the overlap length l are indicated in FIG. 3 for a pair of teeth 312 located at the left-hand side of combs $310_1$ and $310_2$. The environmental exposure to typically causes the SIR of sensor 120 to decrease, e.g., due to dust and/or salt accumulation, creep corrosion, and electrochemical migration.

Different instances of sensor 120 used in circuit 100 (FIG. 1) may differ from one another in one or more of the following: (i) the material of combs $310_1$ and $310_2$; (ii) the spacing s between adjacent teeth 312; (iii) the overlap length l of opposing teeth 312. Example materials that can be used to make combs $310_1$ and $310_2$ include but are not limited to copper, silver, aluminum, nickel, zinc, iron, and various alloys and/or multi-layered metal structures thereof. The materials for combs $310_1$ and $310_2$ are typically selected from the material set used in PCB 102, IC packages $130_1$-$130_N$, and other electronic circuits and devices expected to be located in the same equipment cabinet as circuit 100. In an example embodiment, sensors $120_1$-$120_M$ may include at least one sensor 120 whose combs $310_1$ and $310_2$ are made of copper plated with silver and at least one sensor 120 whose combs $310_1$ and $310_2$ are made of copper plated with tin.

Figure 4:
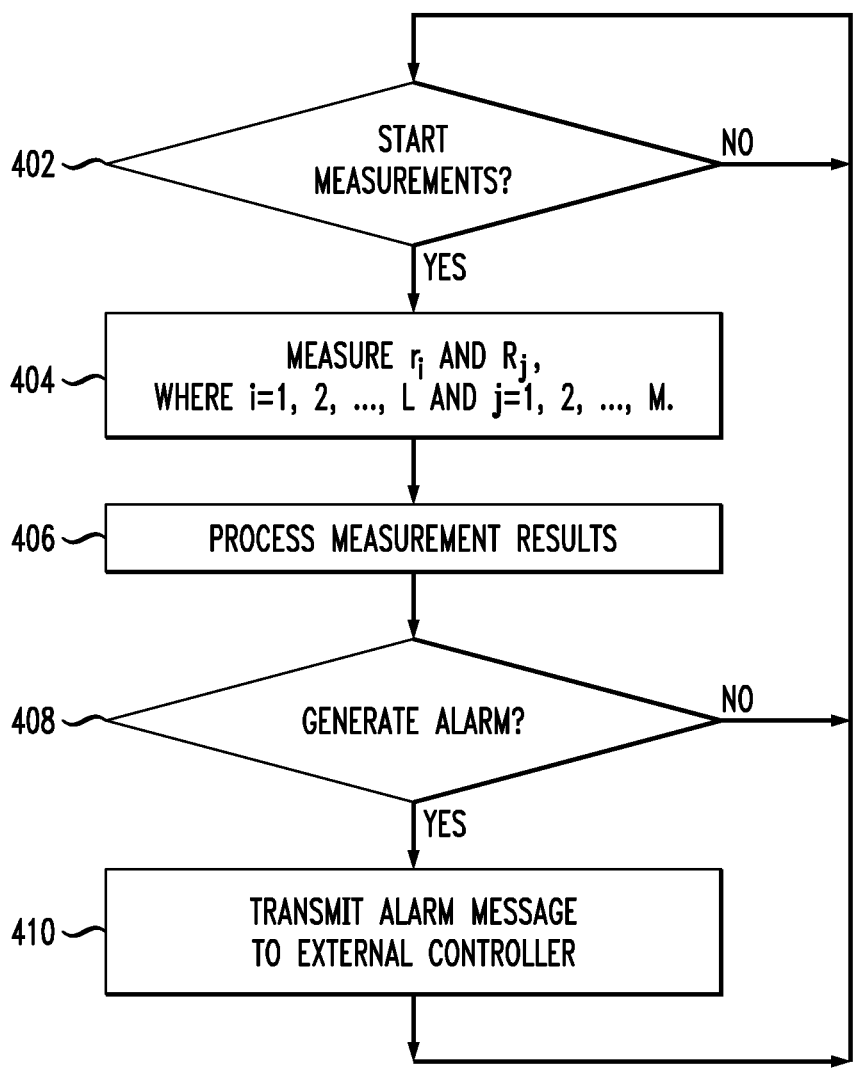
FIG. 4 shows a flowchart of a method of estimating the condition of an electrical circuit according to an embodiment.

FIG. 4 shows a flowchart of a method 400 of estimating the condition of an electrical circuit located in relatively close proximity to sensors $110_1$-$110_L$ and $120_1$-$120_M$ (FIG. 1) according to an embodiment. In some embodiments, the electrical circuit whose condition is being estimated using method 400 comprises one or more of IC packages $130_1$-$130_N$. In other embodiments, the electrical circuit whose condition is being estimated using method 400 comprises one or more electronic circuits and/or devices housed in the same equipment enclosure as circuit 100 (FIG. 1).

At step 402 of method 400, it is determined whether or not to start resistance measurements of sensors $110_1$-$110_L$ and $120_1$-$120_M$. In one example embodiment, an external electronic controller can initiate the resistance measurements by applying, e.g., by way of conductive tracks 144, an appropriate control signal to circuit 140. In another example embodiment, circuit 140 can run an internal timer and initiate the resistance measurements when the timer runs out. In yet another example embodiment, circuit 140 can initiate the resistance measurements in accordance with a predetermined schedule, e.g., stored in a non-volatile memory of the circuit. In some embodiments, circuit 140 can be configured to initiate resistance measurements of sensors $110_1$-$110_L$ and $120_1$-$120_M$ in response to any of a plurality of triggers that may include but are not limited to the above-indicated triggers based on an externally generated control signal, an internal timer, and a predetermined schedule.

If resistance measurements of sensors $110_1$-$110_L$ and $120_1$-$120_M$ are initiated at step 402, then the processing of method 400 is directed to step 404. Otherwise, circuit 140 remains in a waiting mode by cycling through step 402.

At step 404, circuit 140 measures, e.g., as known in the pertinent art, the respective resistances of each of sensors $110_1$-$110_L$ and $120_1$-$120_M$ or of any desired subset of those sensors. In an example embodiment, a resistance measurement carried out at step 404 may include the sub-steps of (i) applying a fixed voltage to a selected sensor and (ii) sensing and measuring the electrical current flowing through that sensor under the applied voltage. In an alternative embodiment, a resistance measurement carried out at step 404 may include the sub-steps of (i) driving a fixed current through a selected sensor and (ii) sensing and measuring the resulting voltage generated across that sensor. The resistance values of individual sensors can then be obtained by computing a ratio of the voltage to the current. The resistance values obtained at step 404 are typically time-stamped and stored in a nonvolatile memory of circuit 140, e.g., for retrieval at a later time and/or for further processing at step 406.

At step 406, circuit 140 processes the resistance values obtained at step 404 to estimate the condition of one or more electrical circuits located in relatively close proximity to sensors $110_1$-$110_L$ and $120_1$-$120_M$. In some embodiments, the data processing of step 406 may also use the resistance values stored in the nonvolatile memory of circuit 140 at one or more previous occurrences of step 404 corresponding to other (e.g., earlier) measurement times. In various embodiments, the data processing carried out at step 406 may include one or more data-processing operations selected from an example set of data-processing operations described in more detail below.

A first example data-processing operation that can be used at step 406 comprises comparing a measured resistance value with a threshold resistance value.

In an example embodiment, each of sensors $110_1$-$110_L$ and $120_1$-$120_M$ can be assigned a respective set of threshold resistance values. Such set of threshold resistance values may include, e.g., three different threshold resistance values, each indicative of a respective different degree of damage to the corresponding electrical circuit caused by the environmental exposure at the deployment site. The measured resistance value of the sensor can then be compared with each of these threshold resistance values to approximately gauge the condition of the circuit.

For example, sensor $110_i$ can be assigned three threshold resistance values $\rho_{i1} < \rho_{i2} < \rho_{i3}$, where the threshold resistance value $\rho_{i1}$ is greater than the initial resistance $r_{i0}$ of sensor $110_i$, and i=1, 2, . . . , L. As used herein, the term "initial resistance" refers to the resistance of the sensor at the factory, prior to the field deployment of circuit 100. The threshold resistance values $\rho_{i1}$, $\rho_{i2}$, and $\rho_{i3}$ can be selected, e.g., as follows:
- (i) the measured resistance $r_i$ of sensor $110_i$ smaller than $\rho_{i1}$ indicates that the corresponding electrical circuit is likely to be in a satisfactory working condition;
- (ii) the measured resistance $r_i$ of sensor $110_i$ being in the interval between $\rho_{i1}$ and $\rho_{i2}$ indicates that the corresponding electrical circuit has likely sustained some minor damage;
- (iii) the measured resistance $r_i$ of sensor $110_i$ being in the interval between $\rho_{i2}$ and $\rho_{i3}$ indicates that the corresponding electrical circuit has likely sustained moderate damage and may need to be replaced or repaired relatively soon; and
- (iv) the measured resistance $r_i$ of sensor $110_i$ greater than $\rho_{i3}$ indicates that the corresponding electrical circuit has likely sustained serious damage, might fail at any time, and needs to be replaced or repaired in an expeditious manner.

As another example, sensor $120_j$ can be assigned three threshold resistance values $\sigma_{j1} > \sigma_{j2} > \sigma_{j3}$, where the threshold resistance value $\sigma_{j1}$ is smaller than the initial surface insulation resistance $R_{j0}$ of sensor $120_j$, and j=1, 2, . . . , M. The threshold resistance values $\sigma_{j1}$, $\sigma_{j2}$, and $\sigma_{j3}$ can be selected, e.g., as follows:
- (i) the measured surface insulation resistance $R_j$ of sensor $120_j$ greater than $\sigma_{j1}$ indicates that the corresponding electrical circuit is likely to be in a satisfactory working condition;
- (ii) the measured surface insulation resistance $R_j$ of sensor $120_j$ being in the interval between $\sigma_{j1}$ and $\sigma_{j2}$ indicates that the corresponding electrical circuit has likely sustained some minor damage;
- (iii) the measured surface insulation resistance $R_j$ of sensor $120_j$ being in the interval between $\sigma_{j2}$ and $\sigma_{j3}$ indicates that the corresponding electrical circuit has likely sustained moderate damage and may need to be replaced or repaired relatively soon; and
- (iv) the measured surface insulation resistance $R_j$ of sensor $120_j$ greater than $\sigma_{j3}$ indicates that the corresponding electrical circuit has likely sustained serious damage, might fail at any time, and needs to be replaced or repaired in an expeditious manner.

Another example data-processing operation that can be used at step 406 comprises computing a rate of resistance change and comparing the computed rate with a threshold rate.

For example, for sensor $110_i$, the rate $v_i$ of resistance change can be computed in accordance with Eq. (1):

$$v_i = \{r_i(t_2) - r_i(t_1)\}/(t_2 - t_1) \tag{1}$$

where $r_i(t_2)$ is the resistance of sensor $110_i$ measured at time $t_2$; $r_i(t_1)$ is the resistance of sensor $110_i$ measured at time $t_1$; and $t_2 > t_1$. The rate $v_i$ computed in this manner can then be compared with a corresponding threshold rate $\lambda_i$. Similarly, for sensor $120_j$, the rate $V_j$ of surface insulation resistance change can be computed in accordance with Eq. (2):

$$V_j = \{R_j(t_1) - R_j(t_2)\}/(t_2 - t_1) \tag{2}$$

where $R_j(t_1)$ is the surface insulation resistance of sensor $120_j$ measured at time $t_1$; $R_j(t_2)$ is the surface insulation resistance of sensor $120_j$ measured at time $t_2$; and $t_2 > t_1$. The rate $V_j$ computed in this manner can then be compared with a corresponding threshold rate $\mu_j$. The threshold rates $\lambda_i$ and $\mu_j$ can be selected such that any rate $v_i$ greater than $\lambda_i$ and/or any rate $V_j$ greater than $\mu_j$ are indicative of an unacceptably harsh environment that might warrant relocation of the corresponding equipment from the current site or another appropriate remedial action by the equipment operator.

Yet another example data-processing operation that can be used at step 406 comprises computing an overall "health" indicator H for the corresponding equipment. In one possible embodiment, the health indicator H can be computed in accordance with Eq. (3):

$$H = \sum_{i=1}^{L} \frac{A_i}{r_i} + \sum_{j=1}^{M} B_j R_j \tag{3}$$

where $A_i$ is a fixed weighting coefficient corresponding to sensor $110_i$, and $B_j$ is a fixed weighting coefficient corresponding to sensor $120_j$. A person of ordinary skill in the art will understand that the value of the health indicator H computed in this manner tends to decrease as the environmental-exposure time for circuit 100 increases. Therefore, a health indicator value smaller than a certain designated threshold value $H_0$ (i.e., $H < H_0$) can be used to prompt the equipment operator to conduct or schedule an inspection of the corresponding equipment for possible maintenance and/or repairs to address the deteriorated "health" of the corresponding electrical circuits.

At step 408, circuit 140 uses the signal/data processing results of steps 404 and 406 to determine whether or not an appropriate alarm signal needs to be generated to alert the equipment operator about the deteriorating condition of the corresponding equipment. In various embodiments, various types of alarm signals can be generated depending on the types of data processing carried out at step 406. For example, one or more of the following fixed conditions can be used to cause a corresponding alarm message to be generated and transmitted out at step 410:
- (i) the resistance $r_i$ of sensor $110_i$ measured at step 404 falls into the interval between $\rho_{i1}$ and $\rho_{i2}$;
- (ii) the resistance $r_i$ of sensor $110_i$ measured at step 404 falls into the interval between $\rho_{i2}$ and $\rho_{i3}$;
- (iii) the resistance $r_i$ of sensor $110_i$ measured at step 404 is greater than $\rho_{i3}$;
- (iv) the surface insulation resistance $R_j$ of sensor $120_j$ measured at step 404 falls into the interval between $\sigma_{j1}$ and $\sigma_{j2}$;
- (v) the surface insulation resistance $R_j$ of sensor $120_j$ measured at step 404 falls into the interval between $\sigma_{j2}$ and $\sigma_{j3}$;
- (vi) the surface insulation resistance $R_j$ of sensor $120_j$ measured at step 404 is smaller than $\sigma_{j3}$;
- (vii) the rate $v_i$ of resistance change for sensor $110_i$ computed at step 406 is greater than $\lambda_i$;
- (viii) the rate $V_j$ of resistance change for sensor $120_j$ computed at step 406 is greater than $\mu_j$; and
- (ix) the health indicator H computed at step 406 is smaller than $H_0$.

If it is determined at step 408 that any of the relevant conditions from this condition set is satisfied, then the processing of method 400 is directed to step 410. Otherwise, the processing of method 400 is directed back to step 402.

At step 410, circuit 140 generates an appropriate alarm message that indicates the condition(s) that caused the alarm message to be generated. Circuit 140 then transmits the generated alarm message, e.g., by way of conductive tracks 144, to the corresponding external electronic controller. After the transmission, the processing of method 400 is returned back to step 402. The external electronic controller may respond to the received alarm message by issuing a corresponding alert for the equipment operator.

Figure 5:
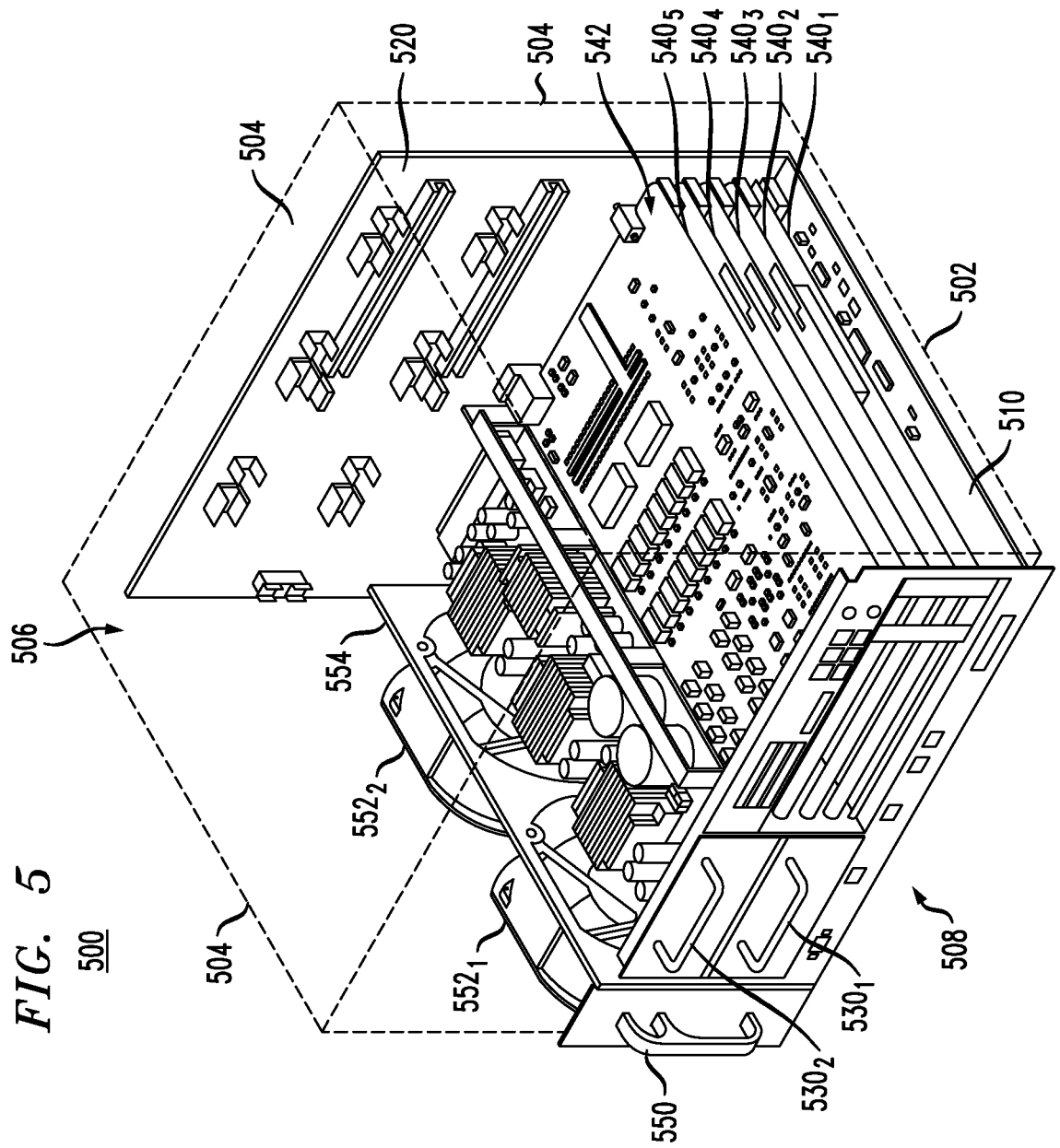
FIG. 5 shows a semi-transparent perspective view of an air-cooled equipment cabinet according to an embodiment.

FIG. 5 shows a semi-transparent perspective view of an equipment cabinet 500 according to an embodiment. Equipment cabinet 500 has rack-mounted equipment located inside the enclosure formed by a base plate 502, peripheral walls 504, and a cover plate 506. For clarity, cover plate 506 and some of the peripheral walls 504 are shown in FIG. 5 using a transparent representation, which enables the contents of equipment cabinet 500 to be visible in the shown view.

In an example embodiment, the equipment housed in equipment cabinet 500 comprises: (i) a main circuit board 510; (ii) a back plane 520; (iii) power-supply drawers $530_1$ and $530_2$; (iv) circuit packs $540_1$-$540_5$; and (v) a fan tray 550. The faceplates of main circuit board 510, power-supply drawers $530_1$ and $530_2$, circuit packs $540_1$-$540_5$, and fan tray 550 form a front panel 508 of equipment cabinet 500, which serves as one of the walls thereof.

Main circuit board 510 is an embodiment of electrical circuit 100 (FIG. 1) and, as such, comprises a plurality of IC packages 130, a plurality discrete circuit elements (such as capacitors, resistors, inductors, and/or active devices), a plurality of sensors 110, a plurality of sensors 120, and sensor drive-and-readout circuit 140, all supported on and electrically connected to the corresponding PCB 102 (also see FIGS. 1 and 6). In operation, main circuit board 510 may support communication between the various electronic components of the equipment housed in equipment cabinet 500 and provide connectors for connecting external circuits and/or devices. In an example embodiment, the IC packages 130 of main circuit board 510 may include significant sub-systems, such as one or more processors, one or more controllers, one or more interface circuits, one or more chipsets configured to support specific functions and/or applications, etc. A more detailed view of an example embodiment of main circuit board 510 is shown in FIG. 6.

Back plane 520 comprises a plurality of electrical connectors configured to electrically interconnect the various equipment pieces housed in equipment cabinet 500 to enable their concerted operation as a functional system. For example, back plane 520 may operate to distribute power-supply voltages/currents generated by the power supplies located in drawers $530_1$ and $530_2$ to main circuit board 510 and circuit packs $540_1$-$540_5$. Back plane 520 may further operate to enable communication between main circuit board 510 and circuit packs $540_1$-$540_5$.

Power-supply drawers $530_1$ and $530_5$ contain power supplies configured to generate various power-supply voltages/currents that can be used to power the various equipment pieces housed in equipment cabinet 500.

Circuit packs $540_1$-$540_5$ may include electrical and/or optical circuits that, in communication with main circuit board 510, enable the equipment housed in equipment cabinet 500 to perform its intended functions. Some or all of circuit packs $540_1$-$540_5$ may also be connected to external circuits using the connectors located on their respective faceplates at front panel 508. At least some of circuit packs $540_1$-$540_5$ may be implemented using respective PCBs. For example, circuit packs $540_1$ includes a PCB that is labeled in FIG. 5 using the reference numeral 542. At least some of circuit packs $540_1$-$540_5$ may be rack-mounted in equipment cabinet 500 in a movable manner, which enables easy extraction of such circuit packs through front panel 508, e.g., for inspection, repair, or replacement.

Fan tray 550 comprises cooling fans $552_1$ and $552_2$. In an example embodiment, a cooling fan 552 comprises an electric motor configured to drive an arrangement of blades and/or vanes, which typically includes a propeller rotated by the motor. Cooling fans $552_1$ and $552_2$ may or may not have air filters installed at the air-intake side thereof. Cooling fans $552_1$ and $552_2$ may or may not have stationary vanes installed at the air-intake side thereof.

When turned ON, the rotating blades (e.g., propellers) of cooling fans $552_1$ and $552_2$ generate an airflow (e.g., propel air) directed from the exterior of equipment cabinet 500, through the exhausts of the fans located on a long side 554 of fan tray 550, into the interior of the equipment cabinet. The air propelled by fans $552_1$ and $552_2$ flows through openings between the various equipment pieces inside equipment cabinet 500 and then exits the equipment cabinet through the air-exhaust vents that are typically located on an opposite side of the cabinet (e.g., on the corresponding wall 504 thereof). The air currents so generated can come into contact with any heated circuit components, thereby cooling them down.

In some environments, the air directed by cooling fans $552_1$ and $552_2$ into the interior of equipment cabinet 500 may also carry dust and salt particles and/or aerosols that can be deposited onto various surfaces inside equipment cabinet 500. Over time, the deposits accumulated in this manner on the surfaces inside equipment cabinet 500 can adversely affect the performance and/or reliability of at least some equipment pieces in various ways. The adverse effects may include but are not limited to: (i) mechanical effects, such as obstructions to the cooling airflow and/or to moving parts; (ii) optical effects, such as interference with the transmission of optical signals (if any); (iii) chemical effects, such as corrosion and metallic dendrite growth; and (iv) electrical effects, such as impedance change, circuit shorts, and open circuits.

Through simulation and experimentation, we have determined that equipment damage associated with the above-listed and possibly other adverse effects of environmental exposure may not be uniform throughout the interior of equipment cabinet 500, as well as within other similarly cooled enclosures. For example, dust deposition rates in different areas of the enclosure may differ by a factor of about 100. Indeed, a deposition per unit area of particulate matter capable of settling out of the airflow may be 10 or more times greater, or even 10 to 200 times greater, on a local area of the sensors 110/120 than an average deposition per unit area of such particulate matter on a major surface of the printed circuit board 102, e.g., for particulate matter with a size or diameter of about 2 microns or more. Therefore, targeted placement of damage sensors, such as sensors 110 and 120, can be important, e.g., for detecting equipment damage with high sensitivity and/or certainty. Accordingly, some embodiments disclosed herein address the targeted placement of damage sensors for this and possibly other purposes, as further detailed below.

For example, we have determined that patterns of equipment damage due to corrosive gases may correlate with the patterns of linear velocity of the airflow. Patterns of equipment damage due to airborne dust and salt may correlate with the patterns of turbulent airflow. Some patterns of equipment damage may correlate with the patterns of airflow characterized by oblique angles of impingement (e.g., 20±10 degrees) on the corresponding surfaces, etc. In an example embodiment, the areas corresponding to at least some of these airflow characteristics may be located directly downstream of the cooling fans (such as fans $552_1$ and $552_2$), e.g., as further detailed below in reference to FIG. 6.

FIG. 6 shows a perspective view of main circuit board 510 according to an embodiment. More specifically, main circuit board 510 is shown in FIG. 6 without its faceplate, which is normally attached to an edge 608 of the main circuit board. When main circuit board 510 is mounted in equipment cabinet 500, an edge 604 of the main circuit board is located next to cooling fans $552_1$ and $552_2$.

In an example embodiment, edge 604 is substantially (e.g., to within ±10 degrees) parallel to long side 554 of the fan tray (also see FIG. 5).

The double-headed arrows $652_1$ and $652_2$ indicate the location of the fan propellers with respect to edge 604 of main circuit board 510. More specifically, the double-headed arrow $652_1$ indicates the orthogonal projection of the propeller of cooling fan $552_1$ on the plane coplanar with the PCB of main circuit board 510. The double-headed arrow $652_2$ similarly indicates the orthogonal projection of the propeller of cooling fan $552_2$ on the same plane. The dashed lines A1 and A2 indicate the respective positions of the rotation axes of the two propellers.

In an example embodiment, edge 604 is substantially (e.g., to within ±10 degrees) orthogonal to rotation axes A1 and A2.

For the equipment-cabinet layout shown in FIGS. 5-6, the airflow patterns associated with the elevated levels of equipment damage (as described above) may predominantly exist in a zone 610. Zone 610 is located directly downstream from cooling fans $552_1$ and $552_2$ and has a width that is approximately the same as the diameter D of the fan propellers, which is also indicated next to the double-headed arrow $652_1$. In this particular example, the operational rotation speed of the propellers is on the order of 4000 rpm.

A person of ordinary skill in the art will understand that, in alternative embodiments, the size and shape of zone 610 may depend on the rotation speed of the propellers and the topology of main circuit board 510 and nearby equipment pieces. For example, in different embodiments, the width of zone 610 may vary from about 0.5D to about 2D.

In an example embodiment, main circuit board 510 is designed such that a relatively large number of sensors 110 and/or 120 is located in the portion of the circuit board located in zone 610.

For example, in one embodiment, at least 50% of sensors 110 and/or 120 are located in the portion of circuit board 510 corresponding to zone 610. The remainder of sensors 110 and/or 120 is located in the remaining portion of circuit board 510, which is labeled in FIG. 6 using the reference numeral 620. Portion 620 is on average located further away from cooling fans $552_1$ and $552_2$ than the portion corresponding to zone 610. In an example embodiment, portion 620 includes an edge 614 of circuit board 510 that is parallel and opposite to edge 604. Portions 610 and 620 may have different respective sizes. Typically, portion 620 may be larger than the portion corresponding to zone 610, which may cause the average surface density of the sensors in portion 620 to be lower than the average surface density of the sensors in the portion corresponding to zone 610.

In another embodiment, at least 80% of sensors 110 and/or 120 are located in the portion of circuit board 510 located in zone 610. The remainder of sensors 110 and/or 120 is located in portion 620.

In yet another embodiment, at least 90% of sensors 110 and/or 120 are located in the portion of circuit board 510 located in zone 610. The remainder of sensors 110 and/or 120 is located in portion 620.

In yet another embodiment, all (i.e., 100%) of sensors 110 and/or 120 are located in the portion of circuit board 510 located in zone 610. In this embodiment, portion 620 has no sensors 110 and/or 120 located therein.

Figure 7A:
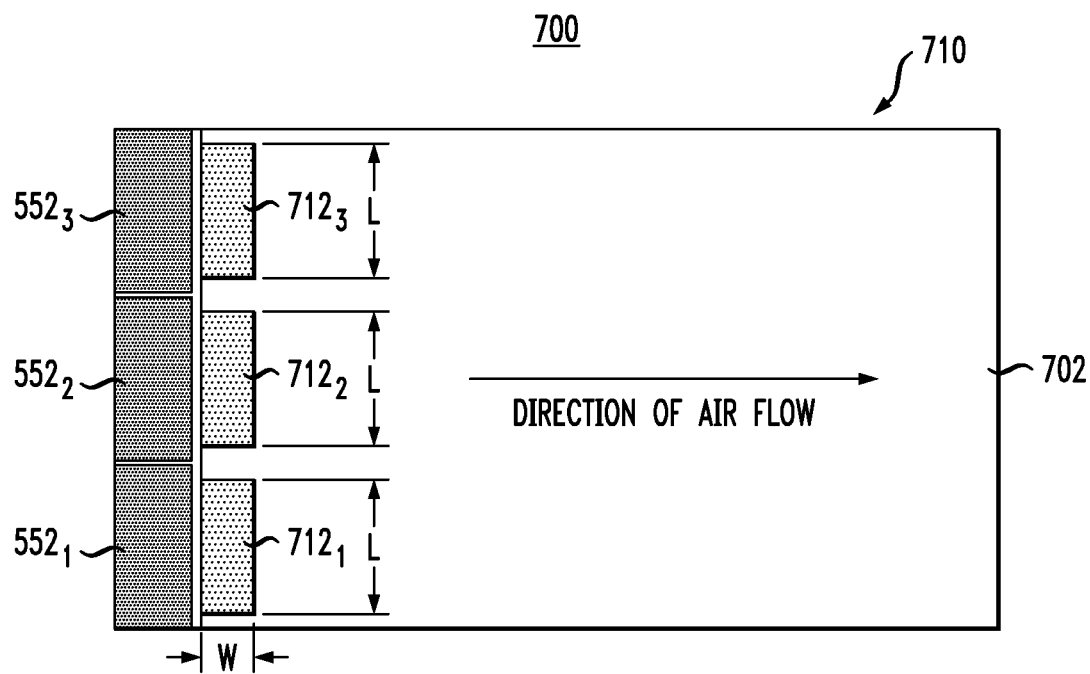
FIGS. 7A-7B show top and side views, respectively, of a fan/circuit arrangement that can be used in the equipment cabinet of FIG. 5 according to an embodiment.
Figure 7B:

FIGS. 7A-7B show top and side views, respectively, of a fan/circuit arrangement 700 that can be used in equipment cabinet 500 according to an embodiment. Arrangement 700 comprises cooling fans $552_1$-$552_3$ and a circuit 710. In an example embodiment, circuit 710 is an embodiment of electrical circuit 100 (FIG. 1) and, as such, comprises a PCB 702 that has a plurality of sensors 110, a plurality of sensors 120, etc. (not explicitly shown in FIG. 7; see FIG. 1).

For arrangement 700, the airflow patterns associated with the elevated levels of equipment damage may predominantly exist in zones $712_1$-$712_3$. Zones $712_1$-$712_3$ are located directly downstream from cooling fans $552_1$-$552_3$, respectively, and have a width W and a length L. In an example embodiment, the width W can be in the range between about 10 mm and about 40 mm. The length L can be close to (e.g., between 50% and 150% of) the diameter D of the fan propellers.

In an example embodiment, circuit 710 can be designed such that a relatively large number of sensors 110 and/or 120 is located in zones $712_1$-$712_3$.

For example, in one embodiment, at least 50% of sensors 110 and/or 120 can be located in zones $712_1$-$712_3$. In another embodiment, at least 80% of sensors 110 and/or 120 can be located in zones $712_1$-$712_3$. In yet another embodiment, at least 90% of sensors 110 and/or 120 can be located in zones $712_1$-$712_3$. In yet another embodiment, all (i.e., 100%) of sensors 110 and/or 120 can be in zones $712_1$-$712_3$.

FIG. 8 shows a side view of a fan/circuit arrangement 800 that can be used in equipment cabinet 500 according to another embodiment. Similar to arrangement 700, arrangement 800 comprises cooling fans $552_1$-$552_3$ and circuit 710. However, in arrangement 800, circuit 710 and cooling fans 552 are vertically offset by the vertical offset distance H, as indicated in FIG. 8. The top view of arrangement 800 may be similar to the top view shown in FIG. 7A.

For arrangement 800, the airflow patterns associated with the elevated levels of equipment damage may predominantly exist in one or more zones 812. In an example embodiment, a zone 812 may be similar to one of zones $712_1$-$712_3$. However, unlike zones $712_1$-$712_3$, zone 812 is not directly adjacent to an edge 804 of PCB 702. For example, a distance B between edge 804 and zone 812 can be between about H and about 4H.

In the embodiment shown in FIG. 8, circuit 710 can be designed such that a relatively large number of sensors 110 and/or 120 is located in zone(s) 812.

FIG. 9 shows an example pattern of circuit damage that can occur in equipment cabinet 500 according to an embodiment. More specifically, FIG. 9 shows a top view of PCB 702 that was used in arrangement 700 (FIGS. 7A-7B). Zones $712_1$-$712_3$ were directly adjacent to fan tray 550, which had cooling fans $552_1$-$552_3$. The darker areas within zones $712_1$-$712_3$ represent the actual damage caused by the deposition of dust/aerosol particles onto PCB 702 inside equipment cabinet 500. The remainder of PCB 702 appears to be relatively free of such damage.

According to an example embodiment disclosed above, e.g., in the summary section and/or in reference to any one or any combination of some or all of FIGS. 1-9, provided is an apparatus comprising: a circuit board (e.g., 510 or 542, FIG. 5; 102, FIG. 1) located in an enclosure; and one or more cooling fans (e.g., 552, FIG. 5) configured to generate airflow by drawing ambient air into the enclosure; wherein the circuit board has a plurality of resistive sensors (e.g., 110 and/or 120, FIG. 1) thereon, the resistive sensors being non-uniformly distributed over at least first and second portions thereof (e.g., 610 and 620, FIG. 6), each of the resistive sensors having a respective electrical resistance that changes in response to damage caused by environmental exposure induced by the airflow, the second surface portion being on average further away from the one or more cooling fans than the first surface portion; and wherein the first surface portion has a greater number of the resistive sensors than the second surface portion.

In some embodiments of the above apparatus, a rotation axis (e.g., A1, FIG. 6) of at least one of the cooling fans is substantially parallel (e.g., to within ±10 degrees) to a major surface of the circuit board. As used herein, the term "major surface" refers to a surface having the larger (e.g., largest or significantly larger) sizes, e.g., length and width, among all surfaces of the circuit board. The surfaces that have one relatively large size, e.g., length, and one relatively small size, e.g., height or thickness, my be referred to as the edges or minor surfaces.

In some embodiments of any of the above apparatus, the first surface portion has a smaller area than the second surface portion.

In some embodiments of any of the above apparatus, the first surface portion has at least 80% of the resistive sensors.

In some embodiments of any of the above apparatus, the first surface portion has at least 90% of the resistive sensors.

In some embodiments of any of the above apparatus, the first surface portion has 100% of the resistive sensors.

In some embodiments of any of the above apparatus, the first surface portion (e.g., 610, FIG. 6) includes a first edge (e.g., 604, FIG. 6) of the circuit board, the first edge being next to a fan tray (e.g., 550, FIG. 5), the one or more cooling fans being in the fan tray.

In some embodiments of any of the above apparatus, the second surface portion (e.g., 620, FIG. 6) includes a second edge (e.g., 614, FIG. 6) of the circuit board, the second edge being opposite to the first edge.

In some embodiments of any of the above apparatus, the first surface portion has a width that is between 0.5D and 2D, the width being a dimension orthogonal to the first edge, where D is a diameter of a cooling-fan propeller (e.g., 652, FIG. 6).

In some embodiments of any of the above apparatus, the first edge is substantially (e.g., to within ±10 degrees) parallel to a long side (e.g., 554, FIG. 5) of the fan tray.

In some embodiments of any of the above apparatus, the first edge is substantially (e.g., to within ±10 degrees) orthogonal to a rotation axis (e.g., A1, FIG. 6) of one of the cooling fans.

In some embodiments of any of the above apparatus, the circuit board (e.g., 510, FIG. 5) is a main circuit board of a system housed in the enclosure and is directly fixedly attached to a base (e.g., 502, FIG. 5) of the enclosure.

In some embodiments of any of the above apparatus, the circuit board (e.g., 542, FIG. 5) is a part of a circuit pack (e.g., 540$_5$, FIG. 5) that is rack-mounted in the enclosure in a movable manner.

In some embodiments of any of the above apparatus, the plurality of resistive sensors comprises a plurality of first sensors (e.g., 110, FIG. 2), each of the first sensors being characterized by a respective electrical resistance that increases in response to the sensor being damaged by the environmental exposure.

In some embodiments of any of the above apparatus, the plurality of resistive sensors further comprises a plurality of second sensors (e.g., 120, FIG. 3), each the second sensors being characterized by a respective electrical resistance that decreases in response to the sensor being damaged by the environmental exposure.

In some embodiments of any of the above apparatus, the plurality of resistive sensors comprises a plurality of first sensors (e.g., 120, FIG. 2), each of the first sensors being characterized by a respective electrical resistance that decreases in response to the sensor being damaged by the environmental exposure.

In some embodiments of any of the above apparatus, the first surface portion (e.g., 812, FIG. 8) is separated from a first edge (e.g., 804, FIG. 8) of the circuit board by a third surface portion (e.g., B, FIG. 8), the first edge being next to a fan tray (e.g., 550, FIG. 5), the one or more cooling fans being in the fan tray; and wherein the third surface portion has a smaller number of the resistive sensors than the first surface portion.

In some embodiments of any of the above apparatus, the third surface portion does not have any of the resistive sensors.

In some embodiments of any of the above apparatus, the third surface portion has a width that is between H and 4H, the width being a dimension orthogonal to the first edge, where H is a vertical offset distance between the circuit board and the one or more cooling fans (e.g., as in FIG. 8).

In some embodiments of any of the above apparatus, the first surface portion has a width that is between 1 cm and 4 cm, the width being a dimension orthogonal to the first edge.

According to another example embodiment disclosed above, e.g., in the summary section and/or in reference to any one or any combination of some or all of FIGS. 1-9, provided is an apparatus comprising: a circuit board (e.g., 510 or 542, FIG. 5; 102, FIG. 1) located in an enclosure for electrical equipment; one or more fans (e.g., 552, FIG. 5) configured to generate an airflow along a major surface of the circuit board by drawing external air into the enclosure, each of the one or more fans having an exhaust (e.g., an opening in 554, FIG. 5) along an edge (e.g., 604, FIG. 6) of the circuit board; and a plurality of resistive sensors (e.g., 110 and/or 120, FIG. 1) supported on the circuit board, the resistive sensors being on average closer to the exhaust than most of the circuit board, each of the resistive sensors having a respective electrical resistance configured to change in response to damage caused by material carried in the airflow.

In some embodiments of the above apparatus, the exhaust is oriented to cause the airflow to have a substantial velocity component (e.g., at least 50% of the total air velocity) parallel to the major surface of the circuit board.

In some embodiments of any of the above apparatus, some of the resistive sensors of the plurality are located adjacent to the edge of the circuit board.

In some embodiments of any of the above apparatus, said some of the resistive sensors include at least 80% of the resistive sensors of the plurality.

In some embodiments of any of the above apparatus, the plurality of resistive sensors are located in a region (e.g., 712, FIG. 7A) susceptible to receipt of a turbulent part of the airflow generated by the one or more fans.

In some embodiments of any of the above apparatus, the edge of the circuit board is located next to a fan tray (e.g., 550, FIG. 5), the one or more fans being in the fan tray.

In some embodiments of any of the above apparatus, the edge is substantially parallel to a long side (e.g., 554, FIG. 5) of the fan tray.

In some embodiments of any of the above apparatus, most (e.g., at least 50%) of the resistive sensors of the plurality are in local areas (e.g., 712, FIG. 7A or 9) susceptible to accumulation per unit surface area of particulate matter capable of settling out of the airflow that is greater than average accumulation per unit surface area of said particulate matter on the circuit board.

In some embodiments of any of the above apparatus, the local areas are susceptible to accumulation per unit area of said particulate matter that is greater by at least a factor of ten than said average accumulation.

In some embodiments of any of the above apparatus, the one or more fans are connected to draw said external air from an exterior of a building or structure in which the enclosure is located.

In some embodiments of any of the above apparatus, the enclosure is configured to be mounted on a shelf for electronic equipment.

In some embodiments of any of the above apparatus, the enclosure is a substantially closed enclosure (e.g., as shown in FIG. 5). As used herein the term "substantially" should be interpreted to mean that at least 70% of the external surface area of the enclosure is impenetrable to air.

In some embodiments of any of the above apparatus, most or all of the resistive sensors of the plurality are located between 1 cm and 4 cm from the edge.

In some embodiments of any of the above apparatus, the circuit board (e.g., 542, FIG. 5) is a part of a circuit pack (e.g., $540_5$, FIG. 5) that is rack-mounted in the enclosure in a movable manner.

In some embodiments of any of the above apparatus, the plurality of resistive sensors comprises a first sensor (e.g., 110, FIG. 2) having an electrical resistance configured to increase in response to the first sensor being damaged by the material carried in the airflow.

In some embodiments of any of the above apparatus, the plurality of resistive sensors comprises a second sensor (e.g., 120, FIG. 3) having an electrical resistance configured to decrease in response to the second sensor being damaged by the material carried in the airflow.

According to yet another example embodiment disclosed above, e.g., in the summary section and/or in reference to any one or any combination of some or all of FIGS. 1-9, provided is an apparatus comprising: a circuit board (e.g., 510 or 542, FIG. 5; 102, FIG. 1) located in an enclosure; one or more fans (e.g., 552, FIG. 5) configured to generate an airflow along a major surface of the circuit board by drawing external air into the enclosure, each of the one or more fans having an exhaust (e.g., an opening in 554, FIG. 5) along an edge (e.g., 604, FIG. 6) of the circuit board; and a plurality of resistive sensors (e.g., 110 and/or 120, FIG. 1) located in a local area (e.g., 712, FIG. 7A or 9) susceptible to a heaver deposition per unit area of particulate matter capable of settling out of the airflow than an average deposition per unit area of said particulate matter on the circuit board.

In some embodiments of the above apparatus, the local area is susceptible to a deposition per unit area of said particulate matter that is greater by a factor of ten or more than the average deposition per unit area of said particulate matter on the circuit board.

In some embodiments of any of the above apparatus, the exhaust is oriented to cause the airflow to be incident on the plurality of resistive sensors and have a major component parallel to the major surface of the circuit board.

In some embodiments of any of the above apparatus, most (e.g., >50%) of the resistive sensors of the plurality are located near the edge of the circuit board.

In some embodiments of any of the above apparatus, the plurality of resistive sensors are located in a region susceptible to receipt of a turbulent part of the airflow generated by the one of more fans.

While this disclosure includes references to illustrative embodiments, this specification is not intended to be construed in a limiting sense.

Although some embodiments are described above in reference to main circuit board 510, the invention(s) disclosed herein are not so limited. For example, similar non-uniform distribution of damage sensors can be used in other circuit boards, e.g., the circuit boards used in circuit packs $540_1$-$540_5$ (see FIG. 5).

Although some embodiments are described above in reference to "cooling fans," alternative embodiments are possible in which the fans are configured and operated to more-generally manage the temperature of the corresponding electrical equipment, with such temperature measurement including heating and/or cooling as necessary for proper operability of the electrical equipment.

Various modifications of the described embodiments, as well as other embodiments within the scope of the disclosure, which are apparent to persons skilled in the art to which the disclosure pertains are deemed to lie within the principle and scope of the disclosure, e.g., as expressed in the following claims.

Unless explicitly stated otherwise, each numerical value and range should be interpreted as being approximate as if the word "about" or "approximately" preceded the value or range.

It will be further understood that various changes in the details, materials, and arrangements of the parts which have been described and illustrated in order to explain the nature of this disclosure may be made by those skilled in the art without departing from the scope of the disclosure, e.g., as expressed in the following claims.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the disclosure. The appearances of the phrase "in one embodiment" in various places in the specification are not necessarily all referring to the same embodiment, nor are separate or alternative embodiments necessarily mutually exclusive of other embodiments. The same applies to the term "implementation."

Unless otherwise specified herein, the use of the ordinal adjectives "first," "second," "third," etc., to refer to an object of a plurality of like objects merely indicates that different instances of such like objects are being referred to, and is not intended to imply that the like objects so referred-to have to be in a corresponding order or sequence, either temporally, spatially, in ranking, or in any other manner.

Throughout the detailed description, the drawings, which are not to scale, are illustrative only and are used in order to explain, rather than limit the disclosure. The use of terms such as height, length, width, top, bottom, is strictly to facilitate the description of the embodiments and is not intended to limit the embodiments to a specific orientation. For example, height does not imply only a vertical rise limitation, but is used to identify one of the three dimensions of a three dimensional structure as shown in the figures. Such "height" would be vertical where the electrodes are horizontal but would be horizontal where the electrodes are vertical, and so on. Similarly, while all figures show the different layers as horizontal layers such orientation is for descriptive purpose only and not to be construed as a limitation.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements. The same type of distinction applies to the use of terms "attached" and "directly attached," as applied to a description of a physical structure. For example, a relatively thin layer of adhesive or other suitable binder can be used to implement such "direct attachment" of the two corresponding components in such physical structure.

The described embodiments are to be considered in all respects as only illustrative and not restrictive. In particular, the scope of the disclosure is indicated by the appended claims rather than by the description and figures herein. All changes that come within the meaning and range of equivalency of the claims are to be embraced within their scope.

The description and drawings merely illustrate the principles of the disclosure. It will thus be appreciated that those of ordinary skill in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

As used in this application, the term "circuitry" may refer to one or more or all of the following: (a) hardware-only circuit implementations (such as implementations in only analog and/or digital circuitry); (b) combinations of hardware circuits and software, such as (as applicable): (i) a combination of analog and/or digital hardware circuit(s) with software/firmware and (ii) any portions of hardware processor(s) with software (including digital signal processor(s)), software, and memory(ies) that work together to cause an apparatus, such as a mobile phone or server, to perform various functions); and (c) hardware circuit(s) and or processor(s), such as a microprocessor(s) or a portion of a microprocessor(s), that requires software (e.g., firmware) for operation, but the software may not be present when it is not needed for operation." This definition of circuitry applies to all uses of this term in this application, including in any claims. As a further example, as used in this application, the term circuitry also covers an implementation of merely a hardware circuit or processor (or multiple processors) or portion of a hardware circuit or processor and its (or their) accompanying software and/or firmware. The term circuitry also covers, for example and if applicable to the particular claim element, a baseband integrated circuit or processor integrated circuit for a mobile device or a similar integrated circuit in server, a cellular network device, or other computing or network device.

As used herein and in the claims, the term "provide" with respect to a system, device, or component encompasses designing or fabricating the system, device, or component; causing the system, device, or component to be designed or fabricated; and/or obtaining the system, device, or component by purchase, lease, rental, or other contractual arrangement.

What is claimed is:

1. An apparatus comprising:
a circuit board located in an enclosure for electrical equipment;
one or more fans configured to generate an airflow along a major surface of the circuit board by drawing external air into the enclosure, each of the one or more fans having an exhaust along an edge of the circuit board; and
a plurality of resistive sensors supported on the circuit board, the resistive sensors being on average closer to the exhaust than most of the circuit board, each of the resistive sensors having a respective electrical resistance configured to change in response to damage caused by material carried in the airflow.

2. The apparatus of claim 1, wherein the exhaust is oriented to cause the airflow to have a substantial velocity component parallel to the major surface of the circuit board.

3. The apparatus of claim 1, wherein some of the resistive sensors of the plurality are located adjacent to the edge of the circuit board.

4. The apparatus of claim 1, wherein said some of the resistive sensors include at least 80% of the resistive sensors of the plurality.

5. The apparatus of claim 1, wherein the plurality of resistive sensors are located in a region susceptible to receipt of a turbulent part of the airflow generated by the one or more fans.

6. The apparatus of claim 1, wherein the edge of the circuit board is located next to a fan tray, the one or more fans being in the fan tray.

7. The apparatus of claim 6, wherein the edge is substantially parallel to a long side of the fan tray.

8. The apparatus of claim 1, wherein most of the resistive sensors of the plurality are in local areas susceptible to accumulation per unit surface area of particulate matter capable of settling out of the airflow that is greater than average accumulation per unit surface area of said particulate matter on the circuit board.

9. The apparatus of claim 8, where the local areas are susceptible to accumulation per unit area of said particulate matter that is greater by at least a factor of ten than said average accumulation.

10. The apparatus of claim 1, wherein the one or more fans are connected to draw said external air from an exterior of a building or structure in which the enclosure is located.

11. The apparatus of claim 1, wherein the enclosure is configured to be mounted on a shelf for electronic equipment.

12. The apparatus of claim 1, wherein the enclosure is a substantially closed enclosure.

13. The apparatus of claim 1, wherein most or all of the resistive sensors of the plurality are located between 1 cm (centimeter) and 4 cm from the edge.

14. The apparatus of claim 1, wherein the circuit board is a part of a circuit pack that is rack-mounted in the enclosure in a movable manner.

15. The apparatus of claim 1, wherein the plurality of resistive sensors comprises a first sensor having an electrical resistance configured to increase in response to the first sensor being damaged by the material carried in the airflow.

16. The apparatus of claim 15 wherein the plurality of resistive sensors comprises a second sensor having an electrical resistance configured to decrease in response to the second sensor being damaged by the material carried in the airflow.

17. The apparatus of claim 1 wherein the plurality of resistive sensors comprises a first sensor having an electrical resistance configured to decrease in response to the first sensor being damaged by the material carried in the airflow.

18. An apparatus comprising:
   a circuit board located in an enclosure;
   one or more fans configured to generate an airflow along a major surface of the circuit board by drawing external air into the enclosure, each of the one or more fans having an exhaust along an edge of the circuit board; and
   a plurality of resistive sensors located in a local area susceptible to a deposition per unit area of particulate matter capable of settling out of the airflow greater than an average deposition per unit area of said particulate matter on the circuit board.

19. The apparatus of claim 18, wherein the deposition per unit area of said particulate matter on said local area is greater by a factor of ten or more than the average deposition per unit area of said particulate matter on the circuit board.

20. The apparatus of claim 18, wherein the exhaust is oriented to cause the airflow to be incident on the plurality of resistive sensors and have a major component parallel to the major surface of the circuit board.

21. The apparatus of claim 18, wherein most of the resistive sensors of the plurality are located near the edge of the circuit board.

22. The apparatus of claim 18, wherein the plurality of resistive sensors are located in a region susceptible to receipt of a turbulent part of the airflow generated by the one of more fans.

* * * * *